US007587298B2

(12) United States Patent
Logan

(10) Patent No.: US 7,587,298 B2
(45) Date of Patent: Sep. 8, 2009

(54) DIAGNOSTIC METHOD FOR ROOT-CAUSE ANALYSIS OF FET PERFORMANCE VARIATION

(75) Inventor: Lyndon R. Logan, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 139 days.

(21) Appl. No.: 11/871,368

(22) Filed: Oct. 12, 2007

(65) Prior Publication Data

US 2009/0099819 A1   Apr. 16, 2009

(51) Int. Cl.
*H01L 41/00* (2006.01)
(52) U.S. Cl. .............. 702/182; 365/226; 324/719; 324/765; 324/769; 324/537; 438/14; 438/17; 327/516
(58) Field of Classification Search .......... 702/182; 365/189.05, 201, 159, 226; 324/713, 716, 324/719, 763, 765, 769, 537; 438/14, 17; 327/516, 538, 540, 541, 543
See application file for complete search history.

(56) References Cited

U.S. PATENT DOCUMENTS

| 3,946,327 | A  | * | 3/1976  | Hsu ......................... 330/277 |
| 6,049,213 | A  | * | 4/2000  | Abadeer .................... 324/719 |
| 6,188,234 | B1 | * | 2/2001  | Abadeer et al. ............. 324/766 |
| 6,583,641 | B2 | * | 6/2003  | Wang et al. ................. 324/765 |
| 7,365,559 | B2 | * | 4/2008  | Colbeck .................... 324/769 |
| 2002/0067651 | A1 | * | 6/2002  | Tsu-Jae ..................... 365/226 |
| 2007/0222496 | A1 | * | 9/2007  | Roesch et al. ............... 327/516 |
| 2008/0048751 | A1 | * | 2/2008  | Koen ........................ 327/308 |
| 2008/0315861 | A1 | * | 12/2008 | Chung et al. ............... 324/71.4 |
| 2009/0039869 | A1 | * | 2/2009  | Williams ................ 324/123 R |

* cited by examiner

*Primary Examiner*—Carol S Tsai
(74) *Attorney, Agent, or Firm*—Schmeiser, Olsen & Watts; Steven Capella

(57) ABSTRACT

A diagnostic method of and computer system for root-cause analysis of performance variations of FETs in integrated circuits and a method and computer system for monitoring a field effect transistor manufacturing process. The diagnostic method includes measuring source currents in the linear and saturated regions of two FETs, calculating ratios of the source currents in the linear and saturated regions for the and two FETs and comparing the ratios of the two FETs to determine a probable root cause for a performance variation between the two FETs. One of the FETs has a known good performance.

20 Claims, 6 Drawing Sheets

DIAGNOSTIC METHOD FOR ROOT-CAUSE ANALYSIS OF FET PERFORMANCE VARIATION

FIELD OF THE INVENTION

The present invention relates to the field of integrated circuits; more specifically, it relates to a diagnostic method for root-cause analysis of performance variations of FETs in integrated circuits.

BACKGROUND OF THE INVENTION

Variations and drifts in FET performance can originate from a variety of physically-distinct mechanisms during integrated circuit manufacture. While some, like gate-oxide thickness/depletion can readily be detected from standard tests. For other mechanisms no routine in-line tests exist. Without knowing the underlying root-cause of performance variations it becomes impossible to evaluate the robustness and manufacturability of a fabrication process. It also makes corrective actions more difficult to decide what corrective actions to take when variations are found and makes allocation of resources for process-control activity difficult. Accordingly, there exists a need in the art to overcome the deficiencies and limitations described hereinabove.

SUMMARY OF THE INVENTION

A first aspect of the present invention is a method of diagnosing the presence of and determining the root cause of a performance variation of a second field effect transistor from a first field effect transistor, comprising: (a) determining a linear threshold voltage of the first field effect transistor, the linear threshold voltage being a first gate voltage level at which a source current begins to flow; (b) determining a saturated threshold voltage of the first field effect transistor, the saturated threshold voltage being a second gate voltage level marking a boundary between a linear operating region of the first field effect transistor where the source current is substantially proportional to applied drain voltage and a saturated operating region of the first field effect transistor where the source current is substantially constant with respect to applied drain voltage; (c) based on the linear threshold voltage, measuring a first linear source current of the first field effect transistor at a third gate voltage at which drain current is substantially proportional to applied gate voltage; (d) based on the saturated threshold voltage, measuring a first saturated source current of the first field effect transistor at a fourth gate voltage at which source current is substantially constant with respect to applied drain voltage; (e) based on the linear threshold voltage, measuring a second linear source current of the second field effect transistor at the third gate voltage; (f) based on the saturated threshold voltage, measuring a second saturated source current of the second field effect transistor at the fourth gate voltage; (g) comparing a first ratio of the first linear source current to the first saturated source current to a second ratio of the second linear source current to the second saturated source current; and (h) based on relative values of the first and second ratios, selecting a portion of the second field effect transistor to analyze for physical or process variance.

A second aspect of the present invention is a method of monitoring a field effect transistor manufacturing process, comprising: (a) determining a linear threshold voltage of a base field effect transistor, the linear threshold voltage being a first gate voltage level at which a source current begins to flow; (b) determining a saturated threshold voltage of the base field effect transistor, the saturated threshold voltage being a second gate voltage level marking a boundary between a linear operating region of the first field effect transistor where the source current is substantially proportional to applied drain voltage and a saturated operating region of the first field effect transistor where the source current is substantially constant with respect to applied drain voltage; (c) based on the linear threshold voltage, measuring a first linear source current of the base field effect transistor at a third gate voltage at which drain current is substantially proportional to applied gate voltage; (d) based on the saturated threshold voltage, measuring a first saturated source current of the base field effect transistor at a fourth gate voltage at which drain current is substantially constant with respect to applied gate voltage; (e) selecting an additional field effect transistor; (f) based on the linear threshold voltage, measuring a second linear source current of the additional field effect transistor at the third gate voltage, the second field effect transistor manufactured after the first field effect transistor; (g) based on the saturated threshold voltage, measuring a second saturated source current of the additional field effect transistor at the fourth gate voltage; (h) comparing the first linear source current to the second linear source current and comparing the first saturated source current to a the second linear source current; (i) if (1) a first ratio of the first linear source current to the first saturated source current is greater than a second ratio of the second linear source current to the second saturated source current by a first predetermined amount, or (2) the first ratio is less than the second ratio by a second predetermined amount, determining a root cause for the differings; and (j) periodically repeating steps (e) through (i).

A third aspect of the present invention is a computer system comprising a processor, an address/data bus coupled to the processor, and a computer-readable memory unit coupled to communicate with the processor, the memory unit containing instructions that when executed by the processor implement a method for a method of diagnosing the presence of and determining the root cause of a performance variation of a second field effect transistor from a first field effect transistor, the method comprising the computer implemented steps of: (a) measuring a linear threshold voltage of the first field effect transistor, the linear threshold voltage being a first gate voltage level at which a source current begins to flow; (b) measuring a saturated threshold voltage of the first field effect transistor, the saturated threshold voltage being a second gate voltage level marking a boundary between a linear operating region of the first field effect transistor where the source current is substantially proportional to applied drain voltage and a saturated operating region of the first field effect transistor where the source current is substantially constant with respect to applied drain voltage; (c) based on the linear threshold voltage, measuring a first linear source current of the first field effect transistor at a third gate voltage at which source current is substantially proportional to applied drain voltage; (d) based on the saturated threshold voltage, measuring a first saturated source current of the first field effect transistor at a fourth gate voltage at which source current is substantially constant with respect to applied drain voltage; (e) based on the linear threshold voltage, measuring a second linear source current of the second field effect transistor at the third gate voltage; (f) based on the saturated threshold voltage, measuring a second saturated source current of the second field effect transistor at the fourth gate voltage; (g) comparing a first ratio of the first linear source current to the first saturated source current to a second ratio of the second linear source current to the second saturated source current; and (h) displaying results of the comparing on a display unit of the system.

A fourth aspect of the present invention is a computer system comprising a processor, an address/data bus coupled to the processor, and a computer-readable memory unit coupled to communicate with the processor, the memory unit containing instructions that when executed by the processor implement a method for a method of monitoring a field effect transistor manufacturing process, the method comprising the computer implemented steps of: (a) measuring a linear threshold voltage of a base field effect transistor, the linear threshold voltage being a first gate voltage level at which a source current begins to flow; (b) measuring a saturated threshold voltage of the base field effect transistor, the saturated threshold voltage being a second gate voltage level marking a boundary between a linear operating region of the first field effect transistor where the source current is substantially proportional to applied drain voltage and a saturated operating region of the first field effect transistor where the source current is substantially constant with respect to applied drain voltage; (c) based on the linear threshold voltage, measuring a first linear source current of the base field effect transistor at a third gate voltage at which drain current is substantially proportional to applied gate voltage; (d) based on the saturated threshold voltage, measuring a first saturated source current of the base field effect transistor at a fourth gate voltage at which drain current is substantially constant with respect to applied gate voltage; (e) selecting an additional field effect transistor; (f) based on the linear threshold voltage, measuring a second linear source current of the additional field effect transistor at the third gate voltage, the second field effect transistor manufactured after the first field effect transistor; (g) based on the saturated threshold voltage, measuring a second saturated source current of the additional field effect transistor at the fourth gate voltage; (h) comparing a first ratio of the first linear source current to the first saturated source current and comparing a second ratio of the second linear source current to the second saturated source current; (i) storing results of the comparing in a database of the computer system; and (j) periodically repeating steps (e) through (i).

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Figure 1:
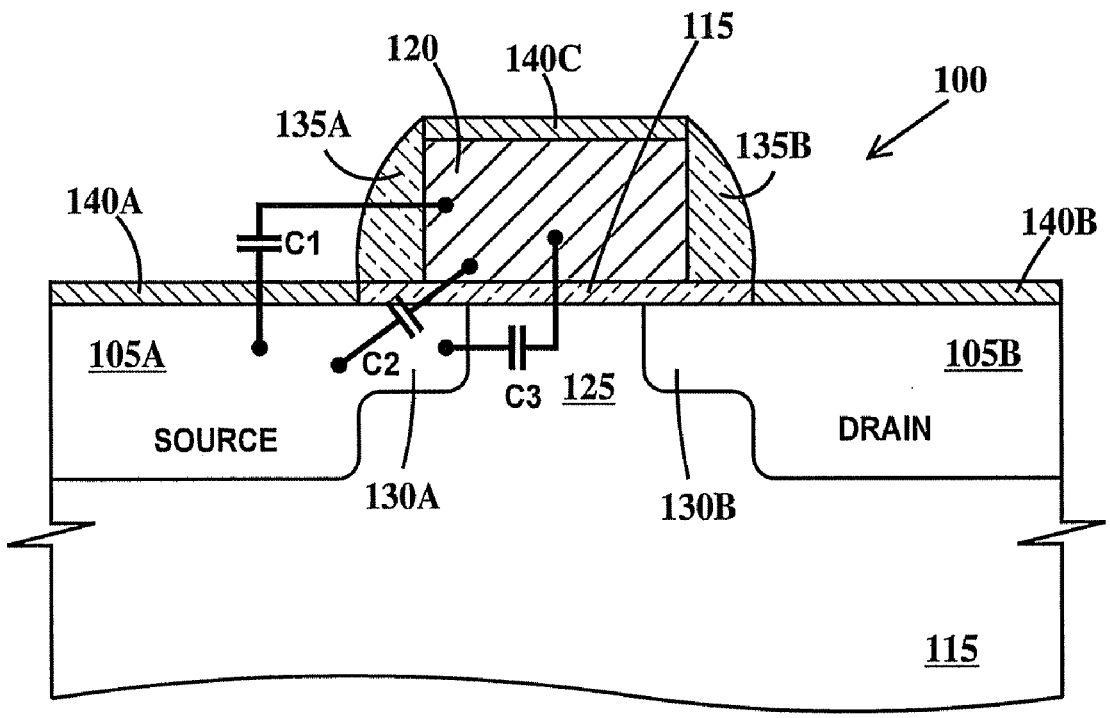
FIG. 1 is diagram of an FET illustrating the structure of an FET and various parasitic capacitances present.

FIG. 1 is diagram of an FET illustrating the structure of an FET and various parasitic capacitances present. In FIG. 1 an FET (field effect transistor) 100 includes a source 105A and a drain 105B formed in a substrate 110. A gate dielectric layer 115 is formed on a top surface of substrate 105 and a gate electrode 120 (e.g., polysilicon) is formed on the gate dielectric layer. A channel region 125 of FET 100 is a region of substrate 110 between source 105A and drain 105B under gate electrode 120. A source extension 130A extends from source 105A under a dielectric spacer 135A formed on a sidewall of gate electrode 120 and a drain extension 130B extends from drain 105B under a dielectric spacer 135B formed on an opposite sidewall of gate electrode 120. Metal silicide layers 140A, 140B and 140C provide low resistance contact respectively to source 105A, drain 105B and gate electrode 120. For an n-channel FET (NFET), source 105A and drain 105B are doped N-type and channel region 125 is doped P-type. For a p-channel FET1 (PFET), source 105A and drain 105B are doped P-type and channel region 125 is doped N-type.

Additional structures, not illustrated in FIG. 1, are electrically conductive contacts to metal silicide layers 140A, 140B, and 140C and metal wires in interlevel dielectric layers electrically contacting the conductive contacts and wiring FET 100 with other devices to form an integrated circuit.

Three parameters of interest for FET 100 include the gate dielectric thickness (Tox), the overlap capacitance (Cov), and the external resistance (Rext). Tox is the thickness (either physical or electrical equivalant) of gate dielectric layer 115. Cov on the source side of FET 100 includes a fringe capacitance C1 between gate electrode 120 and source 105A, a plate capacitance C2 between source extension 130A and gate electrode 120 and a fringe capacitance C3 through channel region 125 to source /source extension 105A/130A. Similar capacitances exist on the drain side of FET 100 though C1, C2 and C3 are only illustrated on the source side of FET 100 in FIG. 1. Rext for the source side of FET includes metal silicide layer 140A to source 105A resistance, contact resistance between metal silicide layer 140A and its respective contact, sheet resistance of source extension 130A and resistance due to the spreading of electrons at the source extension 130A/channel 125 interface. Rext for the drain side of FET includes metal silicide layer 140B to source 105B resistance, contact resistance between metal silicide layer 140B and its respective contact, sheet resistance of source extension 130B and resistance due to the spreading of holes at the drain extension 130B/channel 125 interface.

The embodiments of the present invention are applicable to testing FETs where Tox and Cov have been eliminated as sources of the variation between a known good FET, hereinafter FET1 and a suspect FET (e.g., an FET with degraded performance). hereinafter FET2. Examples of degraded performance include, but are not limited to increased contact resistance or decreased mobility due to problems with stressfilms. Tox and Cov variations between FET1 and FET2 can be determined by simple test techniques. Tox may be measured by gate leakage. Cov may be measured by standard capacitance measurement techniques.

Figure 2:
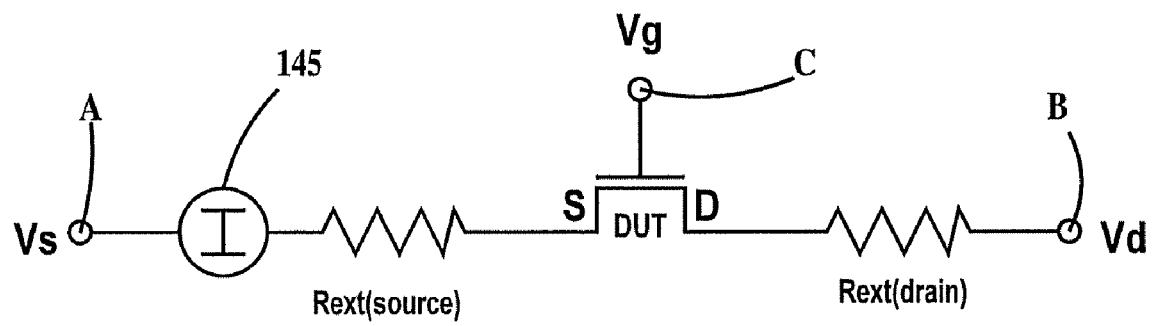
FIG. 2 is a circuit diagram illustrating the method of electrically testing an FET according to the embodiments of the present invention.

FIG. 2 is a circuit diagram illustrating the method of electrically testing an FET according to the embodiments of the present invention. In FIG. 2, a DUT (either FET1 or FET2) is placed in a tester so separate voltages may be applied to the source (labeled "S") of the DUT through pin A, to the drain (labeled "D") of the DUT through pin B and to the gate of the DUT through pin C. During test, voltages Vs, Vd and Vg are applied to pins A, B and C respectively and the current flow through the source is measured by current meter 145. FIG. 2. also shows that Rext (source) is in series between current meter 145 and the source of the DUT, current meter 145 is in series between pin A and Rext (source), and Rext (drain) is in series between pin B and the drain of the DUT.

Figure 3:
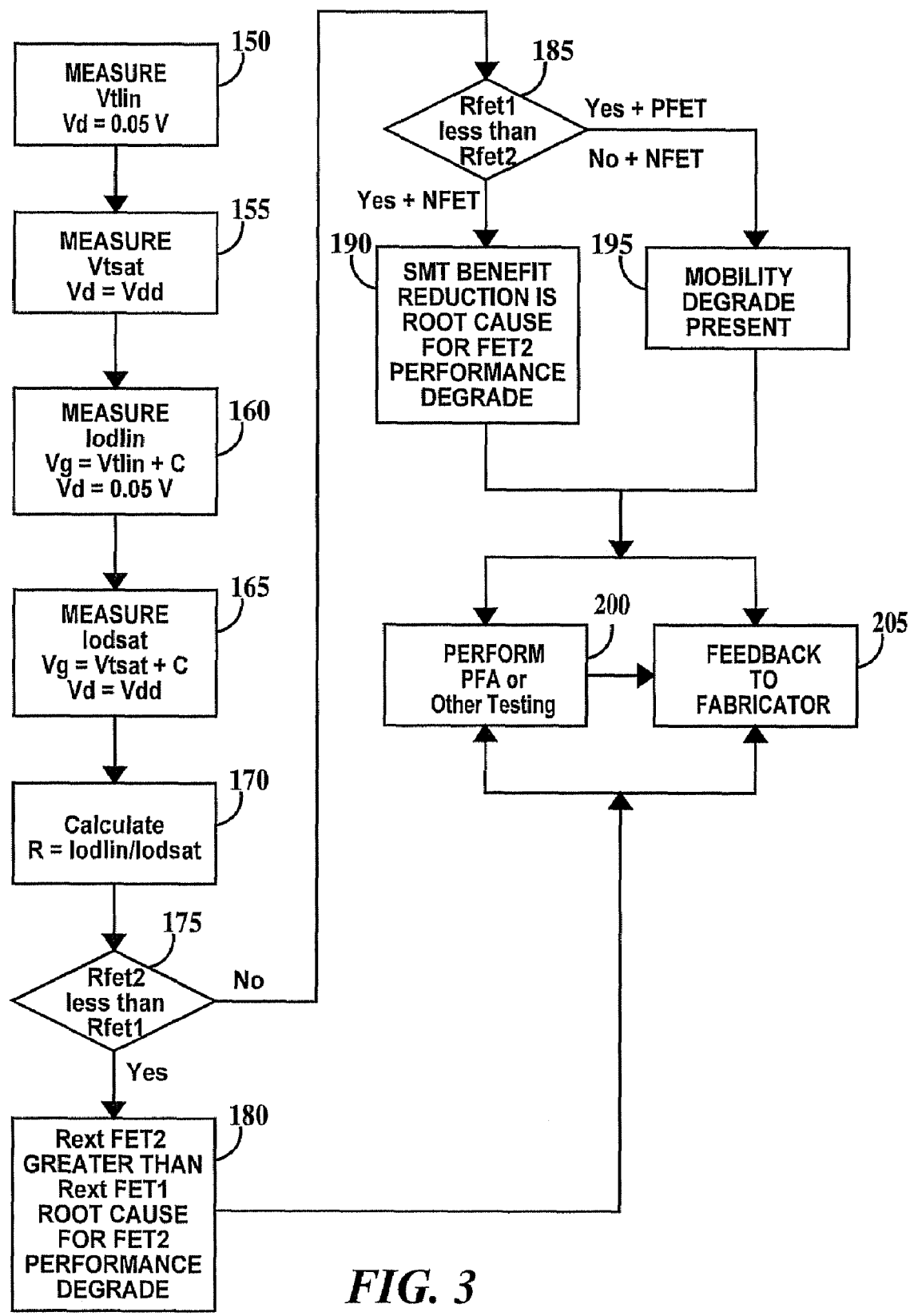
FIG. 3 is a flowchart of the method of testing and diagnosing variations between FETs according to the embodiments of the present invention.

FIG. 3 is a flowchart of the method of testing and diagnosing variations between FETs according to the embodiments of the present invention. FET1 and FET2 must both be NFETs or both be PFETs. FET1 and FET2 are advantageously identically designed, that is, would be physically and electrically identical if the fabrication process were perfect. Vdd is the maximum voltage applied to the drain of an NFET during normal operation of the NFET or applied to the source of a PFET during normal operation of the PFET in an integrated circuit. In steps 150 through 165, reference to FIG. 2 will be useful and pins A, B and C. meter 145 and DUT refer to FIG. 2.

In step 150, the linear threshold voltage (Vtlin) (being a gate voltage level at which a drain current begins to flow) is measured for FET1. For either an NFET or PFET, Vtlin is measured by applying a fixed voltage Vd to pin B, varying the voltage on Vg and plotting the current through meter 145 versus Vg. In one example, for an NFET, Vd=0.05 volts. In one example, for a PFET, Vd=−0.05 volts. In one example, Vd is not equal to zero volts and is equal to about 10% or less of VDD.

In step 155, saturated threshold voltage (Vtsat) (being a gate voltage level marking a boundary between a linear operating region of FET1 where source current is substantially proportional to applied drain voltage and a saturated operating region of FET1 where source current is substantially constant with respect to applied drain voltage) is measured for FET1. For both an NFET and a PFET, Vtsat is measured by applying a fixed voltage Vd to pin B, varying the voltage on Vg and plotting the current through meter 145 versus Vg. In one example, for an NFET, Vd=Vdd volts. In one example, for a PFET, Vd=−Vdd volts. Note, between Vtlin and Vtsat drain current is substantially proportional to applied gate voltage. In one example, Vd is not equal to zero volts and is equal to about 10% or less of VDD.

In step 160, Iodlin (overdrive current in the linear operating region of an FET) is measured for both FET1 and FET2. For both an NFET and a PFET, Vtlin is measured by applying a fixed voltage Vs to pin A, a fixed voltage Vd to pin B, and a fixed voltage Vg to pin C and then measuring the current through meter 145. In one example, for an NFET, Vd is about 0.05 volts. In one example, for an NFET, Vd is equal to about 10% or less of Vdd, but not zero volts. In one example, for a PFET, Vd is about −0.05 volts. In one example, for a PFET, Vd is equal to about 10% or less of −Vdd, but not zero volts. In one example, for an NFET or a PFET, Vs=0 volts. In one example, for an NFET, Vg=Vtlin+C where C is chosen so Vtlin+C is about equal to Vdd. In one example, for a PFET, Vg=Vtlin+C where C is chosen so Vtlin+C is about equal to −Vdd. In one example, for an NFET, Vs=0 volts, Vd=0.05 volts and Vg=Vtlin+C where C is chosen so Vtlin+C is about equal to Vdd. In one example, for a PFET, Vs=0 volts, Vd=−0.05 volts, and Vg=Vtlin+C volts where C is chosen so Vtlin+C is equal to about −Vdd.

In step 165, Iodsat (overdrive current in the saturated operating region of an FET), is measured for both FET1 and FET2. For both an NFET and a PFET, Vtsat is measured by applying a fixed voltage Vs to pin A, a fixed voltage Vd to pin B, and a fixed voltage Vg to pin C and then measuring the current through meter 145. In one example, for an NFET, Vd is equal to about Vdd. In one example, for a PFET, Vd is about −Vdd. In one example, for an NFET or a PFET, Vs=0 volts. In one example, for an NFET, Vg=Vtsat+C where C is chosen so Vtsat+C is about equal to Vdd. In one example, for a PFET, Vg=Vtsat+C where C is chosen so Vtsat+C is about equal to −Vdd. In one example, for an NFET, Vs=0 volts, Vd=Vdds and Vg=Vtsat+C where C is chosen so Vtsat+C is about equal to Vdd. In one example, for a PFET, Vs=0 volts, Vd=−Vdd, and Vg=−(Vtsat+C) volts where C is chosen so Vtsat+C is equal to about −Vdd.

In step 170, the ratio R of Iodlin/Iodsat for FET1 and FET2 is determined.

In step 175 it is determined if R for FET2 is less than R for FET1. If R for FET2 is less than R for FET1, then the method proceeds to step 180, otherwise the method proceeds to step 185.

In step 180, Rext of FET2 being greater than the Rext of FET1 is indicated as the root cause of the performance variation between FET1 and FET2. See FIG. 4 and related discussion infra.

In step 185, it is determined if R for FET1 is less than R for FET2. If R for FET1 is less than R for FET2 and the FETs are NFETs then the method proceeds to step 190, otherwise the method proceeds to step 195 (R for FET1 is less than R FET2 and the FETs are PFETS or R for FT1 is not less than R for FET1 and the FETs are NFETs).

In step 190, a reduction in the stress memorization technique (SMT) process is indicated as the root cause of the performance variation between FET1 and FET2. See FIG. 5 and related discussion infra. An SMT process is a process in which a stress inducing layer (e.g., silicon nitride) is formed over NFETs after the source/drain ion implants but before the anneal of the source/drains. The stress inducing layer is removed after the annealing. SMT is practiced only on NFETs.

In step 195, a reduction in carrier mobility is indicated as the root cause of the performance variation between FET1 and FET2. See FIG. 6 and related discussion infra.

Steps 180, 190 and 195 terminate the testing portion of the method. From steps 180, 190 and 195 the method may proceed to step 200 or to step 205. In step 205, physical failure analysis (PFA), other electrical testing, or other analysis techniques known in the art may be performed. Examples of physical failure analysis and other analysis techniques that may be performed include but are not limited to: physical de-layering, scanning electron microscopy (SEM), cross-sectioning, liquid crystal microscopy, electron beam-induced current (EBIC), voltage contrast microscopy, emission microscopy, ion chromatography, auger electron spectroscopy, secondary ion mass spectroscopy (SIMS), transmission electron microscopy and combinations thereof.

In step 205, the root cause determinations from steps 180, 190 and 195 and/or the results of the analysis done in step 200 are fed-back to the fabricator that fabricated FET1 and FET2 so that corrective actions may be taken, such as adjusting a process or tool.

The embodiments of the present invention may be applied to monitoring a field effect transistor manufacturing process, by performing steps 155 through 160 on a group of FET1s once to establish a base line for Iodlin/Iodsat for FET1s and periodically performing steps 165 and 170 for groups of FET2s and then comparing Iodlin/Iodsat for each group of FET2s to the base line for Iodlin/Iodsat for FET1s.

Figure 4:
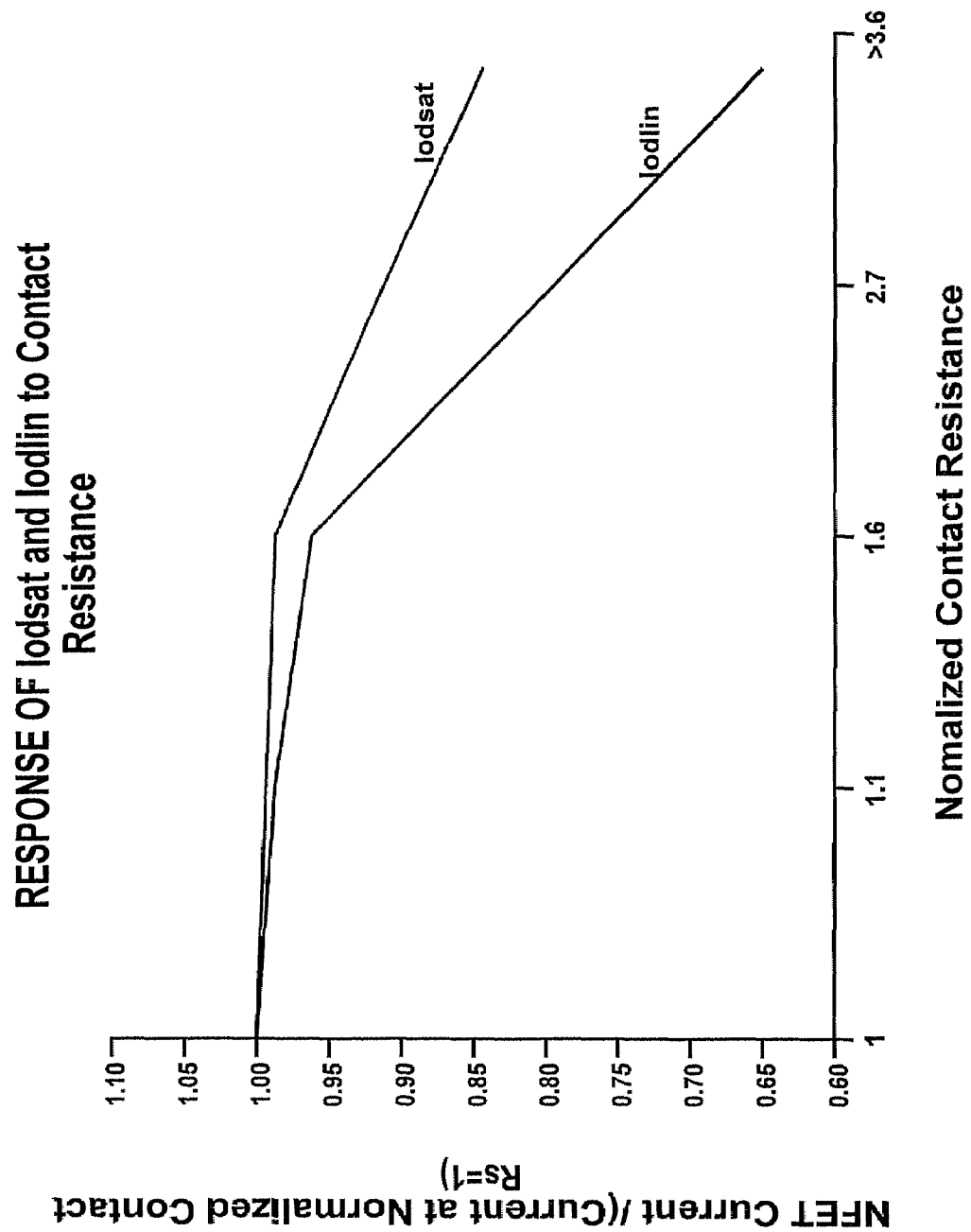
FIG. 4 is a plot of Iodsat and Iodlin versus contact resistance.

FIG. 4 is a plot of Iodsat and Iodlin versus contact resistance which is a component of Rext easily measured. In FIG. 4, the response of linear-current to change contact resistance (component of Rext) is significantly stronger than saturation current. Therefore, by extension, an increase in contact resistance (component of Rext) occurring on FET2 decreases Iodlin (a measure of linear current-overdrive) much more than Iodsat (a measure of saturated current-overdrive). As a result, R=Iodlin/Iodsat decreases in response to an increased Rext on FET2 relative to FET1. Typical causes of Rext are often related to issues involving poor contacting of the contact stud to silicide layers 140A and/or 140B (see FIG. 2), poor silicide layer 140A to source 105A and/or silicide layer 140B to drain 105B (see FIG. 2) interface properties. By way of example, follow-up PFA (cross-sectional SEM or TEM) can sometimes confirm the issue.

Figure 5:
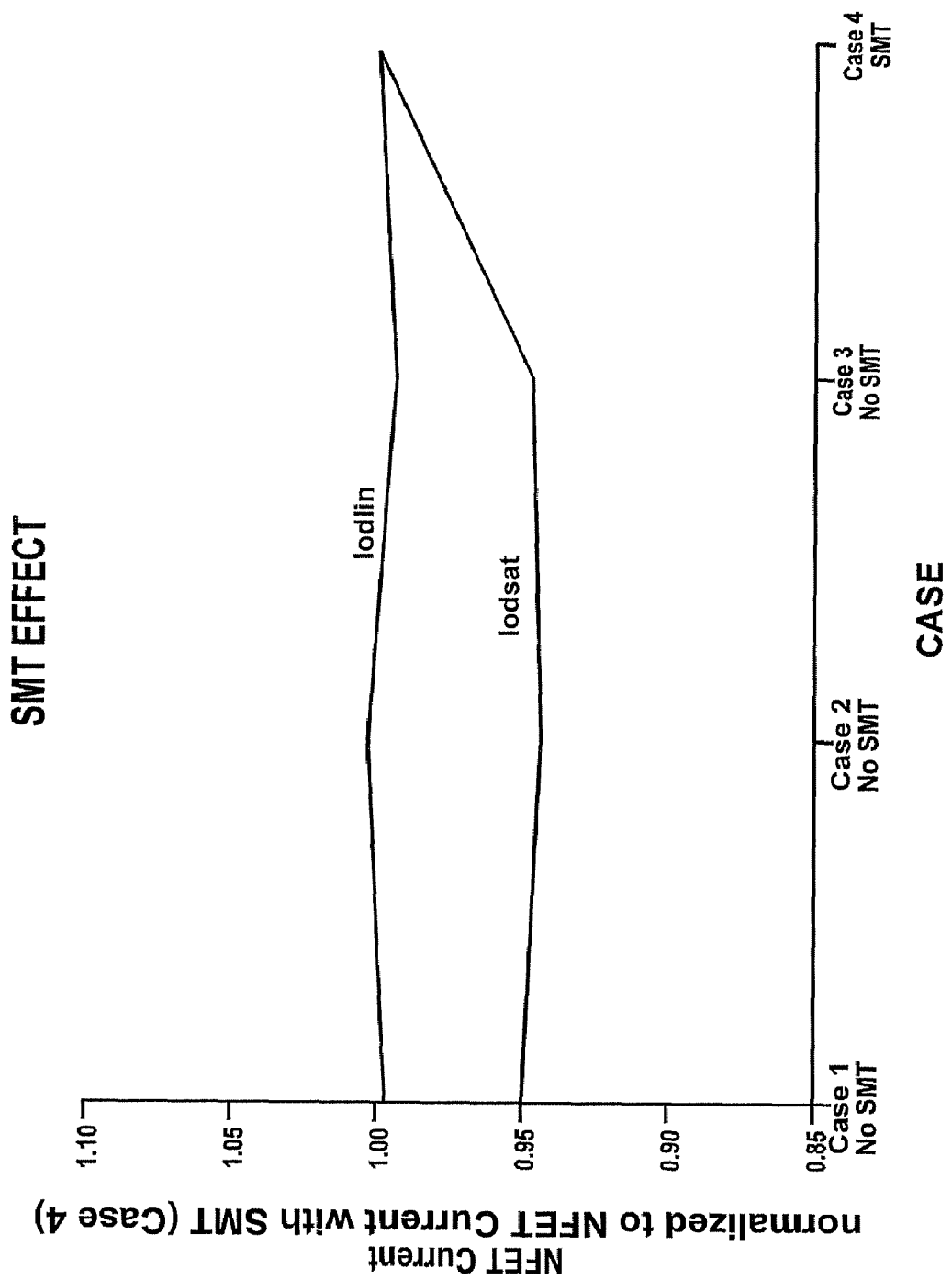
FIG. 5 is a plot of Iodsat and Iodlin as a function of the SMT effect.

FIG. 5 is a plot of Iodsat and Iodlin as a function of the SMT effect. As mentioned supra, SMT is applicable only to comparisons of NFET devices, there is no SMT process used for PFETs. In contrast to the situation encountered with a Rext change, the response of SMT-benefit loss/reduction decreases only the saturated current Iodsat, leaving the linear current Iodlin unchanged so the denominator in the ratio R=Iodlin/Iodsat drops with the numerator being unchanged. Therefore R=Iodlin/Iodsat increases if the SMT-benefit is reduced. In FIG. 5, a saturated-unique current response is illustrated. By way of example, SMT stress film properties and related processes would be the normal follow-on activity.

Figure 6:
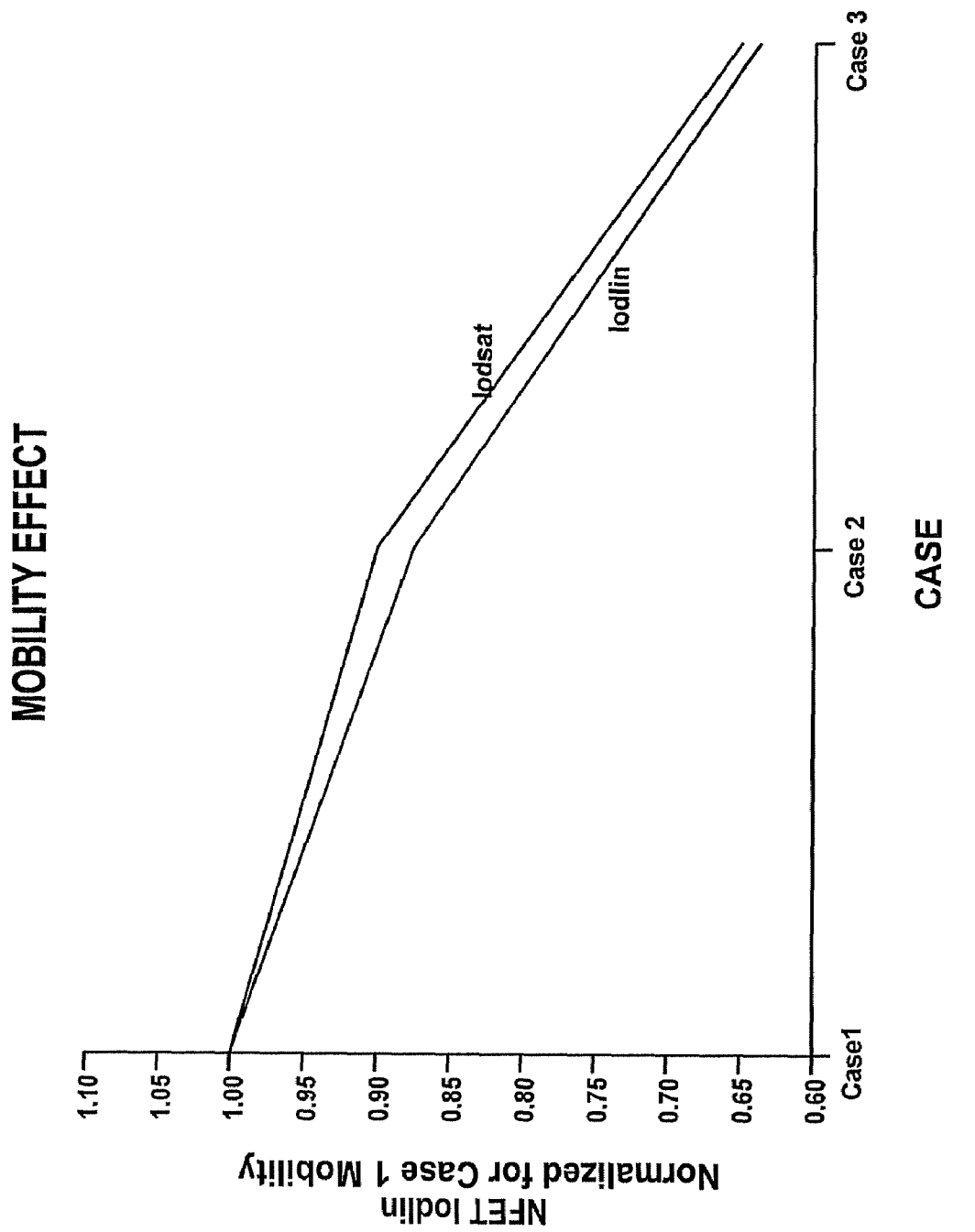
FIG. 6 is a plot of Iodsat and Iodlin as a function of carrier mobility.

FIG. 6 is a plot of Idsat and Iodlin as a function of carrier mobility. A change in mobility leaves R essentially unchanged. Therefore, if a known performance degrade is observed on FET2, and neither Rext or SMT (for NFETs) are implicated, nor are there obvious problems in gate-oxide (always measured), and R=Iodlin/Iodsat is unchanged, then mobility is implicated as the root-cause of the degrade. Typical mobility-degrade mechanisms arise from problem in stress inducing films used post silicide covering both transistor, or from problems in the removal of tensile-nitride from the PFET through poor RIE procedures. By way of example, film analysis and cross-sectional PFA can be used to further diagnose a mobility issue.

The method for testing and diagnosing variations between FETs described supra, may be practiced using one FET 1 and 1 FET2 or using the average values of R=Iodlin/Iodsat from multiple FET1 and FET2 samples. These multiple samples may be across a single chip, a multiple chips on a single wafer or multiple wafers of a single lot. Further, R=Iodlin/Iodsat for FET1 may be from a previously measured FET1 value used as a control and R=Iodlin/Iodsat for FET2 may be measured periodically to monitor the state of the fabricator (process and/or tools) making FET1 and FET2

Thus the embodiments of the present invention provide a method for diagnosing variations and drifts in FET performance that originate from a variety of physically-distinct mechanisms during integrated circuit manufacture.

Figure 7:
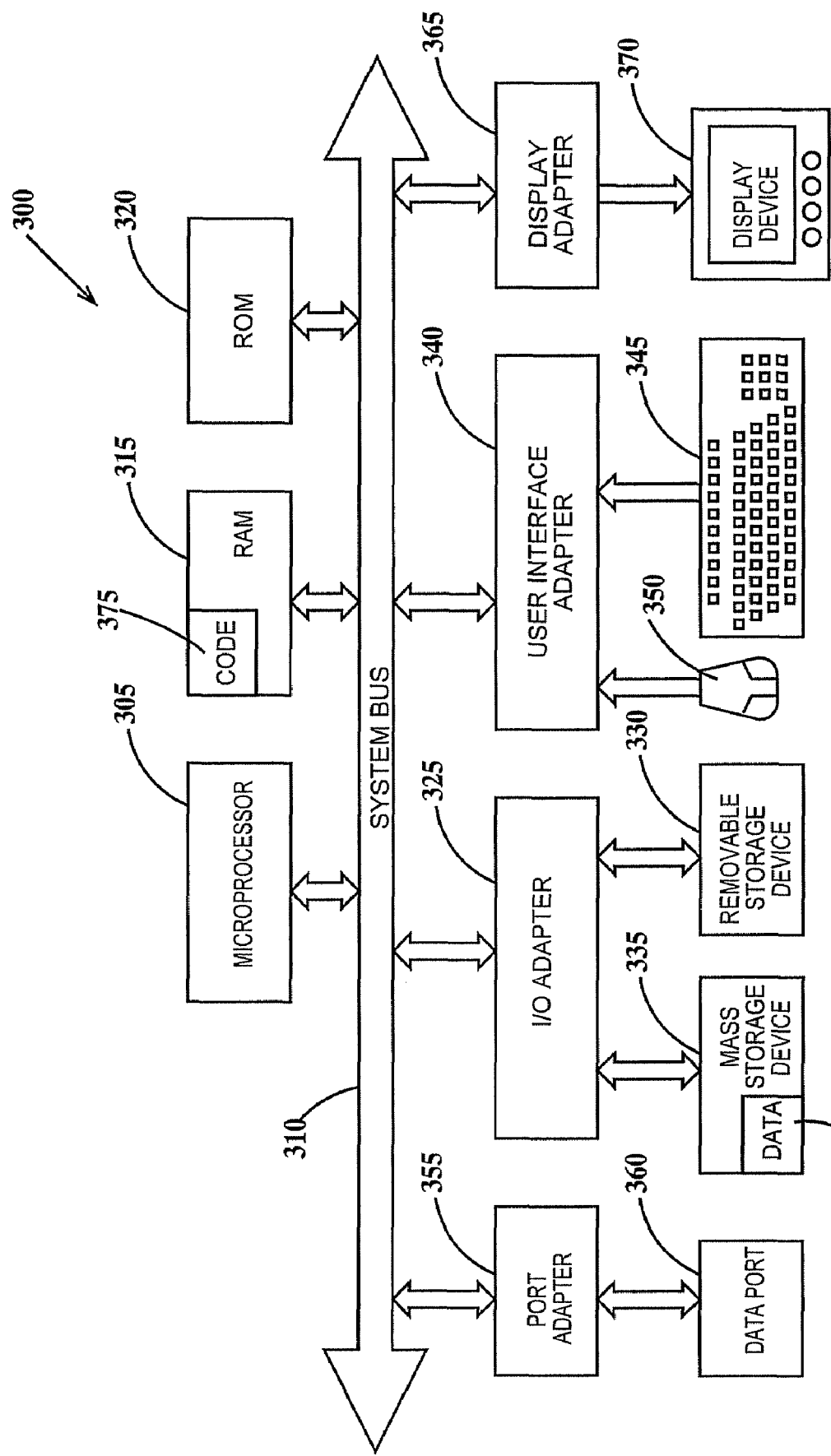
FIG. 7 is a schematic block diagram of a general-purpose computer for practicing the embodiments of the present invention.

FIG. 7 is a schematic block diagram of a general-purpose computer for practicing the embodiments of the present invention. In FIG. 7 computer system 300 has at least one microprocessor or central processing unit (CPU) 305. CPU 305 is interconnected via a system bus 310 to a dynamic random access memory (DRAM) device 315 and a read-only memory (ROM) device 320, an input/output (I/O) adapter 325 for a connecting a removable data and/or program storage device 330 and a mass data and/or program storage device 335, a user interface adapter 330 for connecting a keyboard 335 and a mouse 350, a port adapter 355 for connecting a data port 360 and a display adapter 365 for connecting a display device 370.

Either of devices 315 and 320 includes contains the basic operating system for computer system 300. Removable data and/or program storage device 330 may be a magnetic media such as a floppy drive, a tape drive or a removable hard disk drive or optical media such as CD ROM or a digital video disc (DVD) or solid state memory such as ROM or DRAM or flash memory. Mass data and/or program storage device 335 may be a hard disk drive or an optical drive. In addition to keyboard 335 and mouse 350, other user input devices such as trackballs, writing tablets, pressure pads, microphones, light pens and position-sensing screen displays may be connected to user interface 330. Examples of display devices include cathode-ray tubes (CRT) and liquid crystal displays (LCD).

One of devices 315, 320, 330 or 335 includes a computer code 375 (illustrated by way of example in device 315), which is a computer program that comprises computer-executable instructions. Computer code 375 includes an algorithm for testing and diagnosing variations between FETs (e.g., the algorithm of FIG. 3). CPU 305 executes computer code 375. Any of devices 315, 320, 330 or 335 may include input data 380 (illustrated by way of example in device 335) required by computer code 375. Display device 370 displays output from computer code 375.

Any or all of devices 315, 320, 330 and 335 (or one or more additional memory devices not shown in FIG. 7) may be used as a computer usable medium (or a computer readable medium or a program storage device) having a computer readable program embodied therein and/or having other data stored therein, wherein the computer readable program comprises computer code 375. Generally, a computer program product (or, alternatively, an article of manufacture) of the computer system 300 may comprise the computer usable medium (or the program storage device).

Computer system 300 may direct a tester to perform the actual measurements and then perform the calculations and store and/or output the results or the test data generated by a tester may be entered into the computer system directly from the tester or via a portable data storage media and the computer system then perform the calculations and store and/or output the results. When used as a fabricator monitoring system, computer system 300 may further generate and display temporal control charts of key electrical parameters (e.g., Iodlin and Idosat) values generated by periodic sampling of product flowing through the fabricator.

Thus the present invention discloses a process for supporting computer infrastructure, integrating, hosting, maintaining, and deploying computer-readable code into the computer system 300, wherein the code in combination with the computer system 300 is capable of performing a method for testing and diagnosing variations between FETs and monitoring variations in key electrical parameters of periodically sampled FETs.

The description of the embodiments of the present invention are given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A method of diagnosing the presence of and determining the root cause of a performance variation of a second field effect transistor from a first field effect transistor, comprising:

(a) determining a linear threshold voltage of said first field effect transistor, said linear threshold voltage being a first gate voltage level at which a source current begins to flow;

(b) determining a saturated threshold voltage of said first field effect transistor, said saturated threshold voltage being a second gate voltage level marking a boundary between a linear operating region of said first field effect transistor where said source current is substantially proportional to applied drain voltage and a saturated operating region of said first field effect transistor where said source current is substantially constant with respect to applied drain voltage;

(c) based on said linear threshold voltage, measuring a first linear source current of said first field effect transistor at a third gate voltage at which drain current is substantially proportional to applied gate voltage;

(d) based on said saturated threshold voltage, measuring a first saturated source current of said first field effect transistor at a fourth gate voltage at which source current is substantially constant with respect to applied drain voltage;

(e) based on said linear threshold voltage, measuring a second linear source current of said second field effect transistor at said third gate voltage;

(f) based on said saturated threshold voltage, measuring a second saturated source current of said second field effect transistor at said fourth gate voltage;

(g) comparing a first ratio of said first linear source current to said first saturated source current to a second ratio of said second linear source current to said second saturated source current; and (h) based on relative values of said first and second ratios, selecting a portion of said second field effect transistor to analyze for physical or process variance.

2. The method of claim 1, wherein:

(c) includes setting said third gate voltage equal to said linear threshold voltage plus a constant voltage; and (d) includes setting said fourth gate voltage equal to said saturated threshold voltage plus said constant voltage.

3. The method of claim 2, wherein:

(c) includes choosing said constant voltage so said linear threshold voltage plus said constant voltage is about equal to a normal operating voltage level of said first field effect transistor.

4. The method of claim 2, (a) includes, applying to a drain of said first field effect transistor, a first drain voltage not equal to zero volts and equal to about 10% or less of said normal operating voltage level of said first field effect;

(b) includes, applying to said drain of said first field effect transistor, a second drain voltage about equal to said normal operating voltage level of said first field effect transistor;

(c) includes applying zero volts to a source of said first field effect transistor and applying said first drain voltage to said drain of said first field effect transistor;

(d) includes, applying zero volts to said source of said first field effect transistor and applying said second drain voltage to said drain of said first field effect transistor;

(e) includes, applying zero volts to a source of said second field effect transistor and applying and applying said first drain voltage to a drain of said second field effect transistor; and (f) includes, applying zero volts to the source of said first field effect transistor and applying and applying said second drain voltage to said drain of said second field effect transistor.

5. The method of claim 1, wherein said first field effect transistor and said second field effect transistor are identically designed.

6. A method of monitoring a field effect transistor manufacturing process, comprising:

(a) determining a linear threshold voltage of a base field effect transistor, said linear threshold voltage being a first gate voltage level at which a source current begins to flow;

(b) determining a saturated threshold voltage of said base field effect transistor, said saturated threshold voltage being a second gate voltage level marking a boundary between a linear operating region of said first field effect transistor where said source current is substantially proportional to applied drain voltage and a saturated operating region of said first field effect transistor where said source current is substantially constant with respect to applied drain voltage;

(c) based on said linear threshold voltage, measuring a first linear source current of said base field effect transistor at a third gate voltage at which drain current is substantially proportional to applied gate voltage;

(d) based on said saturated threshold voltage, measuring a first saturated source current of said base field effect transistor at a fourth gate voltage at which drain current is substantially constant with respect to applied gate voltage;

(e) selecting an additional field effect transistor;

(f) based on said linear threshold voltage, measuring a second linear source current of said additional field effect transistor at said third gate voltage, said second field effect transistor manufactured after said first field effect transistor;

(g) based on said saturated threshold voltage, measuring a second saturated source current of said additional field effect transistor at said fourth gate voltage;

(h) comparing said first linear source current to said second linear source current and comparing said first saturated source current to a said second linear source current; and (i) if (1) a first ratio of said first linear source current to said first saturated source current is greater than a second ratio of said second linear source current to said second saturated source current by a first predetermined amount, or (2) said first ratio is less than said second ratio by a second predetermined amount, determining a root cause for said differings, then repeating steps (e) through (i).

7. The method of claim 6, wherein:

(c) includes setting said third gate voltage equal to said linear threshold voltage plus a constant voltage; and setting said fourth gate voltage equal to said saturated threshold voltage plus said constant voltage.

8. The method of claim 7, wherein:

(c) includes choosing said constant voltage so said linear threshold voltage plus said constant voltage is about equal to a normal operating voltage level of said base field effect transistor.

9. The method of claim 7, (a) further including, applying to a drain of said base field effect transistor a first drain voltage not equal to zero volts and equal to about 10% or less of said normal operating voltage level of said base field effect transistor;

(b) further including, applying to said drain of said base field effect transistor, a second drain voltage about equal to said normal operating voltage level of said base field effect transistor;

(c) further including, applying zero volts to a source of said base field effect transistor and applying said first drain voltage to said drain of said base field effect transistor;

(d) further including, applying zero volts to said source of said base field effect transistor and applying and applying said second drain voltage to said drain of said base field effect transistor;

(f) further including, applying zero volts to a source of said additional field effect transistor and applying and applying said first drain voltage to a drain of said additional field effect transistor; and (g) further including, applying zero volts to the source of said base field effect transistor and applying and applying said second drain voltage to said drain of said additional field effect transistor.

10. The method of claim 6, wherein said base field effect transistor and said additional field effect transistor are identically designed.

11. A computer system comprising a processor, an address/data bus coupled to said processor, and a computer-readable memory unit coupled to communicate with said processor, said memory unit containing instructions that when executed by the processor implement a method for a method of diagnosing the presence of and determining the root cause of a performance variation of a second field effect transistor from a first field effect transistor, said method comprising the computer implemented steps of:

(a) measuring a linear threshold voltage of said first field effect transistor, said linear threshold voltage being a first gate voltage level at which a source current begins to flow;

(b) measuring a saturated threshold voltage of said first field effect transistor, said saturated threshold voltage being a second gate voltage level marking a boundary between a linear operating region of said first field effect transistor where said source current is substantially proportional to applied drain voltage and a saturated operating region of said first field effect transistor where said source current is substantially constant with respect to applied drain voltage;

(c) based on said linear threshold voltage, measuring a first linear source current of said first field effect transistor at a third gate voltage at which source current is substantially proportional to applied drain voltage;

(d) based on said saturated threshold voltage, measuring a first saturated source current of said first field effect transistor at a fourth gate voltage at which source current is substantially constant with respect to applied drain voltage;

(e) based on said linear threshold voltage, measuring a second linear source current of said second field effect transistor at said third gate voltage;

(f) based on said saturated threshold voltage, measuring a second saturated source current of said second field effect transistor at said fourth gate voltage;

(g) comparing a first ratio of said first linear source current to said first saturated source current to a second ratio of said second linear source current to said second saturated source current; and (h) displaying results of said comparing on a display unit of said system.

12. The computer system of claim 11, wherein method step (c) includes setting said third gate voltage equal to said linear threshold voltage plus a constant voltage;

method step (e) includes setting said third gate voltage equal to said linear threshold voltage plus said constant voltage;

method step (d) includes setting said fourth gate voltage equal to said saturated threshold voltage plus said constant voltage; and method step (f) includes setting said fourth gate voltage is equal to said saturated threshold voltage plus said constant voltage.

13. The computer system of claim 12, wherein method step (c) includes choosing said constant voltage so said linear threshold voltage plus said constant voltage is about equal to a normal operating voltage level of said first field effect transistor.

14. The computer system of claim 12, method step (a) includes applying to a drain of said first field effect transistor, a first drain voltage not equal to zero volts and equal to about 10% or less of said normal operating voltage level of said first field effect transistor;

method step (b) includes applying to said drain of said first field effect transistor, a second drain voltage about equal to said normal operating voltage level of said first field effect transistor;

method step (c) includes applying zero volts to a source of said first field effect transistor and applying said first drain voltage to said drain of said first field effect transistor;

method step (d) includes applying zero volts to said source of said first field effect transistor and applying said second drain voltage to said drain of said first field effect transistor;

method step (e) includes applying zero volts to a source of said second field effect transistor and applying said first drain voltage to a drain of said second field effect transistor; and method step (f) includes applying zero volts to the source of said first field effect transistor and applying said second drain voltage to said drain of said second field effect transistor.

15. The computer system of claim 11, further including the method step of:

based on said comparing, selecting a probable root cause a variance in performance of between said first field effect transistor and said second field effect transistor from a set of root causes and displaying said probable root cause on a display unit of said computer screen.

16. A computer system comprising a processor, an address/data bus coupled to said processor, and a computer-readable memory unit coupled to communicate with said processor, said memory unit containing instructions that when executed by the processor implement a method for a method of monitoring a field effect transistor manufacturing process, said method comprising the computer implemented steps of:

(a) measuring a linear threshold voltage of a base field effect transistor, said linear threshold voltage being a first gate voltage level at which a source current begins to flow;

(b) measuring a saturated threshold voltage of said base field effect transistor, said saturated threshold voltage being a second gate voltage level marking a boundary between a linear operating region of said first field effect transistor where said source current is substantially proportional to applied drain voltage and a saturated operating region of said first field effect transistor where said source current is substantially constant with respect to applied drain voltage;

(c) based on said linear threshold voltage, measuring a first linear source current of said base field effect transistor at a third gate voltage at which drain current is substantially proportional to applied gate voltage;

(d) based on said saturated threshold voltage, measuring a first saturated source current of said base field effect transistor at a fourth gate voltage at which drain current is substantially constant with respect to applied gate voltage;

(e) selecting an additional field effect transistor;

(f) based on said linear threshold voltage, measuring a second linear source current of said additional field effect transistor at said third gate voltage, said second field effect transistor manufactured after said first field effect transistor;

(g) based on said saturated threshold voltage, measuring a second saturated source current of said additional field effect transistor at said fourth gate voltage;

(h) comparing a first ratio of said first linear source current to said first saturated source current and comparing a second ratio of said second linear source current to said second saturated source current; and (i) storing results of said comparing in a database of said computer system.

17. The computer system of claim 16, wherein method step (c) includes setting said third gate voltage equal to said linear threshold voltage plus a constant voltage;

method step (f) includes setting said third gate voltage equal to said linear threshold voltage plus said constant voltage;

method step (d) includes setting said fourth gate voltage equal to said saturated threshold voltage plus said constant voltage; and method step (g) includes setting said fourth gate voltage is equal to said saturated threshold voltage plus said constant voltage.

18. The computer system of claim 17, wherein method step (c) includes choosing said constant voltage so said linear threshold voltage plus said constant voltage is about equal to a normal operating voltage level of said first field effect transistor.

19. The computer system of claim 17, wherein method step (a) includes applying to a drain of said first field effect transistor, a first drain voltage not equal to zero volts and equal to about 10% or less of said normal operating voltage level of said first field effect transistor;

method step (b) includes, applying to said drain of said first field effect transistor, a second drain voltage about equal to said normal operating voltage level of said first field effect transistor;

method step (c) includes, applying zero volts to a source of said first field effect transistor and applying said first drain voltage to said drain of said first field effect transistor;

method step (d) includes, applying zero volts to said source of said first field effect transistor and applying said second drain voltage to said drain of said first field effect transistor;

method step (f) includes, applying zero volts to a source of said second field effect transistor and applying said first drain voltage to a drain of said second field effect transistor; and method step (g) includes, applying zero volts to the source of said first field effect transistor and applying said second drain voltage to said drain of said second field effect transistor.

20. The computer system of claim 16, further including the method step of:

displaying results of said comparing on a display unit of said system.

* * * * *